(12) United States Patent
Youk et al.

(10) Patent No.: US 9,337,248 B2
(45) Date of Patent: May 10, 2016

(54) DISPLAY DEVICE INCLUDING ALIGNMENT MARK AND LIGHT SHIELDING PATTERN

(71) Applicant: LG Display Co., Ltd., Seoul (KR)

(72) Inventors: Seung-Hyun Youk, Paju-si (KR); Chul-Ho Kim, Paju-si (KR); Nam-Kook Kim, Suwon-si (KR); Yun-Ho Kook, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/578,946

(22) Filed: Dec. 22, 2014

(65) Prior Publication Data

US 2016/0093684 A1 Mar. 31, 2016

(30) Foreign Application Priority Data

Sep. 30, 2014 (KR) .......................... 10-2014-0131792

(51) Int. Cl.
*H01L 27/32* (2006.01)
*H01L 51/52* (2006.01)

(52) U.S. Cl.
CPC ........ *H01L 27/3272* (2013.01); *H01L 27/3223* (2013.01); *H01L 51/5243* (2013.01); *H01L 51/5246* (2013.01); *H01L 51/5253* (2013.01); *H01L 51/5293* (2013.01)

(58) Field of Classification Search
CPC .............. H01L 23/544; H01L 27/3272; H01L 51/5284
See application file for complete search history.

(56) References Cited

U.S. PATENT DOCUMENTS

| | | | |
|---|---|---|---|
| 6,204,895 B1* | 3/2001 | Nakamura et al. | 349/5 |
| 2006/0279687 A1* | 12/2006 | Park et al. | 349/142 |
| 2011/0101853 A1* | 5/2011 | Lee et al. | 313/504 |
| 2012/0140143 A1* | 6/2012 | Wurzel | 349/62 |
| 2013/0187839 A1* | 7/2013 | Yang et al. | 345/76 |

* cited by examiner

*Primary Examiner* — John P Dulka
(74) *Attorney, Agent, or Firm* — Dentons US LLP (57) ABSTRACT

Disclosed is a display device that includes a substrate having an active area and a dead area around the active area; an alignment mark on the inside surface of the substrate in a part of the dead area; and a light-shielding pattern on a rear surface of the substrate in the dead area, the light-shielding pattern including a mark hole for exposing the alignment mark. By providing the light-shielding pattern on a display surface in the dead area, the display device has expanded active display area and improved visual appreciation.

15 Claims, 13 Drawing Sheets

PRIOR ART

FIG. 1

Support structure

RECOGNITION DIRECTION
OF ALIGNMENT CAMERA

DISPLAY DEVICE INCLUDING ALIGNMENT MARK AND LIGHT SHIELDING PATTERN

CROSS-REFERENCE TO RELATED APPLICATIONS

This application claims the benefit of Korean Patent Application No. 10-2014-0131792, filed on Sep. 30, 2014, which is hereby incorporated by reference for all purposes.

BACKGROUND OF THE INVENTION

1. Field of the Invention

The present invention relates to a display device and a method for manufacturing the same. More specifically, the present invention relates to a display device expanded active display area and improved visual appreciation.

2. Discussion of the Related Art

In accordance with the evolution of information-dependent society, demand for display devices has vastly increased. In response to this demand, a variety of display devices such as liquid crystal displays (LCDs), organic light emitting diodes (OLEDs), plasma display panels (PDPs), electro-luminescent displays (ELDs) and vacuum fluorescent displays (VFDs) are being researched and utilized as displays for various devices in recent years.

Of these display devices, liquid crystal displays (LCD) and organic light emitting displays (OLEDs) have been developed, satisfying the demand of users due to advantages of lightness, thinness, shortness and smallness, and color clearness.

A display device typically has a thin film transistor array substrate including a thin film transistor as a switching element in each pixel region. The thin film transistor array substrate is provided with a plurality of gate lines and a plurality of data lines intersecting each other and a thin film transistor at each intersection of the gate lines and the data lines. A pad unit is connected to a printed circuit board in an edge portion of the thin film transistor array substrate for applying electric signals to the gate lines and the data lines.

Hereinafter, a conventional display device will be described with reference to the accompanying drawings.

Figure 1:
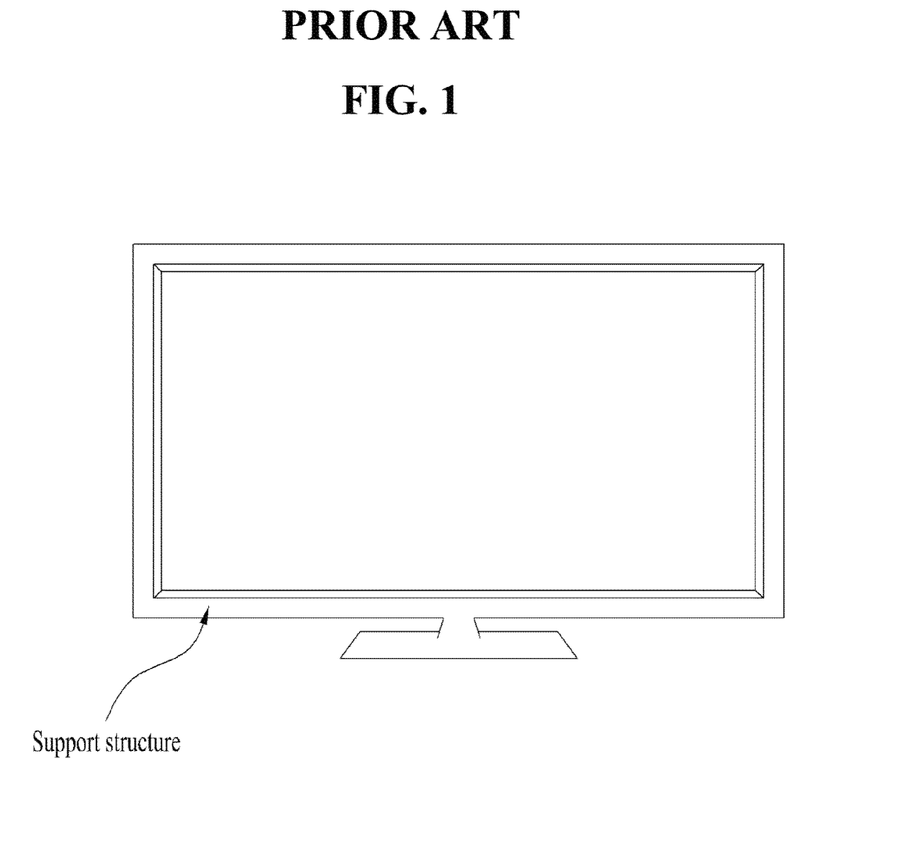
FIG. 1 is a front view illustrating a conventional display device.

FIG. 1 is a front view illustrating a conventional display device.

As shown in FIG. 1, the conventional display device has a configuration in which a support structure such as a housing is surrounded at an edge of a display surface to shield an inner configuration.

In addition, the support structure is typically made of, for example, a plastic material having a predetermined stiffness, which is different from a material for the display surface, protrudes from the display surface, and has a sufficient width for preventing a metal or pad unit present at the edge of the display surface from being seen from the outside, thus causing a decrease in active display area.

Also, the support structure typically has a sufficient thickness and width to prevent exposure of the side surface of the printed circuit board. As a result, the total thickness of the display device increases, and slimness of the display device may become difficult.

SUMMARY OF THE INVENTION

Accordingly, the present invention is directed to provide a display device and method of manufacturing the same that substantially obviates one or more problems due to limitations and disadvantages of the related art.

An advantage of the present invention is to provide a display device with expanded active display area and improved visual appreciation.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a substrate having an active area and a dead area around the active area, the substrate having a pixel array on an inside surface of the substrate in the active area; an alignment mark on the inside surface of the substrate in a part of the dead area; and a light-shielding pattern on a rear surface of the substrate in the dead area, the light-shielding pattern including a mark hole for exposing the alignment mark.

The display device may further include a polarizer formed over the entire rear surface of the substrate such that the polarizer covers the light-shielding pattern.

The light-shielding pattern may be spaced from an edge of the substrate. In this case, the light-shielding pattern is preferably spaced from the edge of the substrate by a distance of 200 μm to 300 μm.

The light-shielding pattern may have a dot shape in which a printing area mixes with a non-printing area at the boundary of the active area and the dead area. The shape of the light-shielding pattern may be changed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Hereinafter, a device display and a method for manufacturing the same according to embodiments of the present invention will be described in detail with reference to the accompanying drawings.

Figure 2:
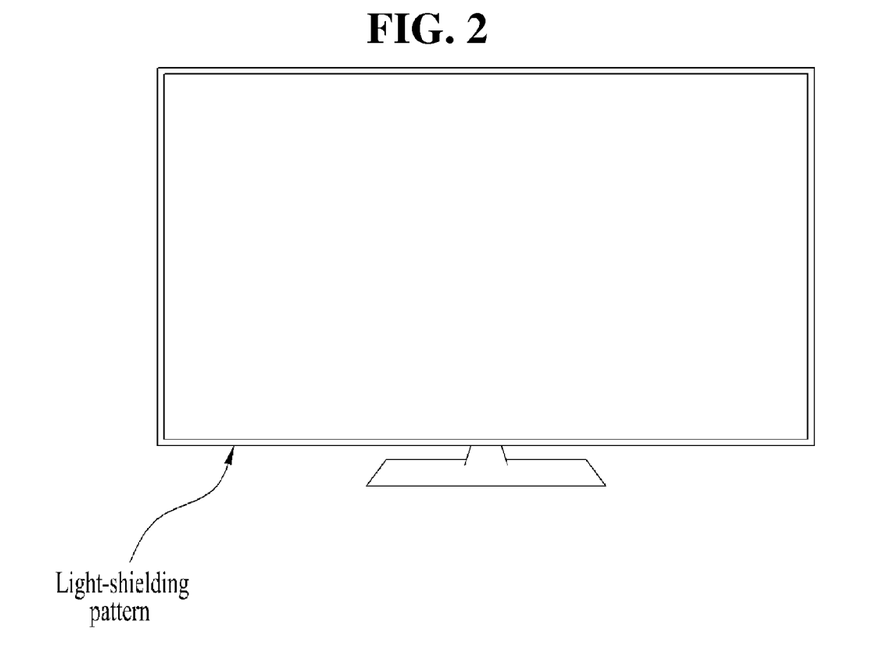
FIG. 2 is a front view illustrating a display device according to an embodiment of the present invention.

FIG. 2 is a front view illustrating a display device according to an embodiment of the present invention.

Referring to FIG. 2, the display device includes a support structure that does not cover a display surface and is accommodated to a rear side of the display surface, together with a printed circuit board.

In order to reduce or prevent a metal and pad unit located at an edge of the display surface from being seen by a viewer, a light-shielding pattern is printed on a rear surface of a thin film transistor array substrate in a region corresponding to the edge of the display surface. The boundary area at the edge of the display surface illustrated in FIG. 2 is the region where the light-shielding pattern is printed on the rear surface, and the remaining area other than the boundary area may become an active display area of the display surface. Compared to the structure shown in FIG. 1, the active display area can be expanded, and a total thickness of the display device can be reduced by omitting a support structure covering the display surface.

In addition, the actual display surface of the display device includes a printed light-shielding pattern, an upper part of which is covered with a polarizer. Thus, the actual display surface is smooth with substantially no protrusion or step in design so that the viewer is able to appreciate clear visual representation.

Hereinafter, a display device according to an embodiment of the present invention will be described with an organic light emitting display device as an example.

Figure 3:
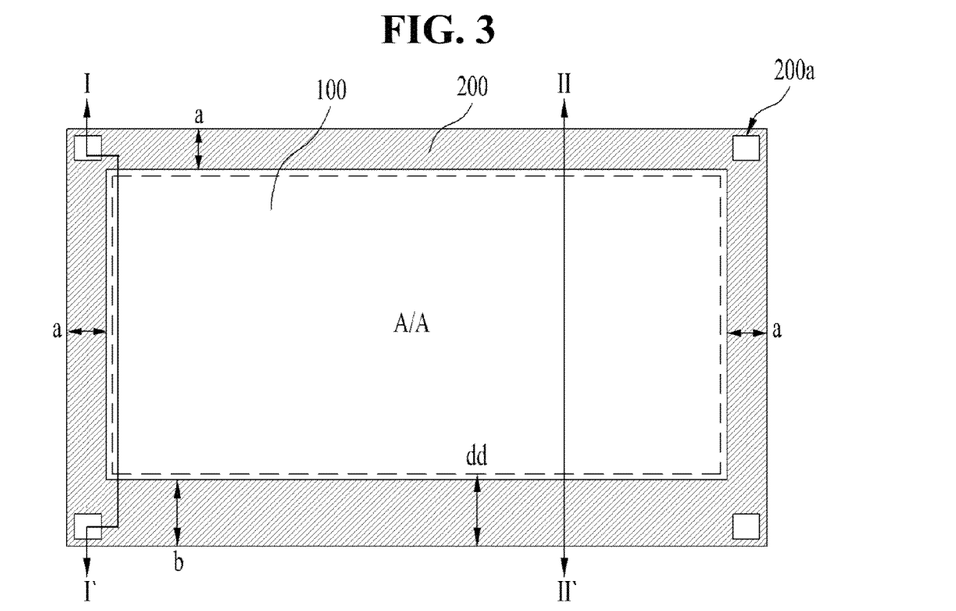
FIG. 3 is a plan view illustrating a display device according to an embodiment of the present invention.
Figure 4:
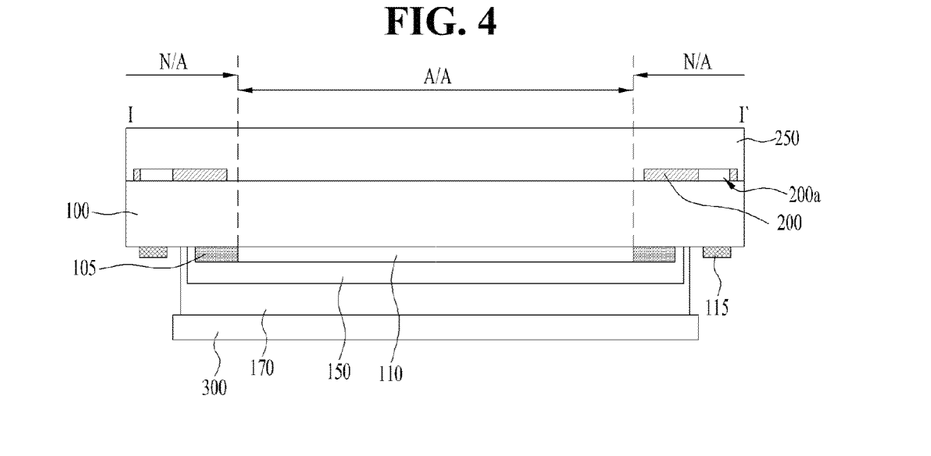
FIG. 4 is a cross-sectional view taken along line I-I' of FIG. 3.
Figure 5:
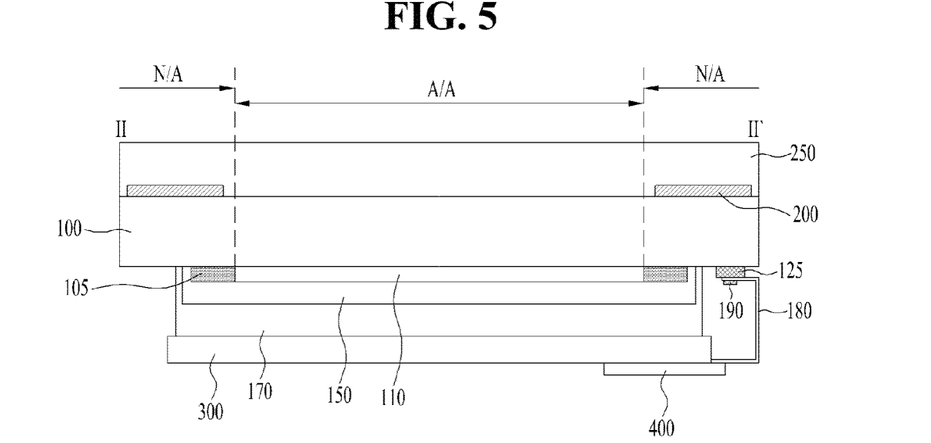
FIG. 5 is a cross-sectional view taken along line II-II' of FIG. 3.

FIG. 3 is a plan view illustrating a display device according to an embodiment of the present invention, FIG. 4 is a cross-sectional view taken along line I-I' of FIG. 3, and FIG. 5 is a cross-sectional view taken along line II-II' of FIG. 3. In particular, FIGS. 3 to 5 illustrate a display panel of the organic light emitting display device according to an embodiment of the present invention.

Referring to FIG. 3, a substrate 100 is divided into an active area A/A indicated by a dotted line and a dead area N/A as the remaining region. In addition, the substrate 100 has two different surfaces: an inner surface where an array configuration such as an array of thin film transistors is formed in the active area A/A and a rear surface.

A light-shielding pattern 200 is formed on the rear surface of the substrate 100 by, for example, a printing method.

The light-shielding pattern 200 is printed such that a part in which a pad unit is disposed in a lower part of the substrate 100 has a relatively great width (b) and the remaining parts have a smaller width (a), as illustrated in FIG. 3. This is because pad electrodes in the pad unit and link lines connecting gate lines and data lines to the respective pad electrodes are provided in the pad unit and, leading to a concentrated area of metal electrodes and lines and thus increasing the dead area N/A compared to other regions.

To reduce or prevent exposure or reflection from the concentrated metal area, the light-shielding pattern 200 may be formed of a material having an optical density of 1 or less and a light-shielding property. A black pigment can be used as the material for the light-shielding pattern 200, but the color of the material is not limited to black and other color pigment such as a white or blue pigment may be used, so long as it can shield the underlying metal layers. In addition, the color of the material of the light-shielding pattern 200 may be determined in consideration of design.

In addition, when the display device is implemented as a wide screen display with a rectangular shape having four sides, the display surface generally has a greater width than a length. In this case, the pad unit may be provided in a lower part of the display surface.

FIG. 4 is a sectional view taken along the line traversing upper and lower parts of the substrate 100 wherein an alignment mark 115 is formed on the substrate 100 in a region corresponding to the light-shielding pattern 200, and FIG. 5 is a sectional view taken along the line traversing the upper and lower parts of the substrate 100 wherein such an alignment mark is not formed on the substrate 100 in the region corresponding to the light-shielding pattern 200.

The display device includes an array of pixels 110 in the active area of the inside surface of the substrate 100 and the alignment mark 115 in a portion of the dead area disposed around the active area. For example, the pixel array 110 may include an array of thin film transistors (not shown) and an array of color filters (not shown), and the alignment mark 115 may be formed during the formation of the pixel array 110, beneficially during the formation of the thin film transistor array.

The thin film transistor array includes a plurality of gate lines and a plurality of data lines which cross each other to define a plurality of pixel regions and a thin film transistor at each of the crossings of the gate lines and the data lines. The alignment mark 115 may be formed at the same time as the gate lines, which may be the first metal formed on the thin film transistor array, and layers formed subsequent to the formation of the alignment mark 115 can be patterned in consideration of distances from the alignment mark 115.

In addition, the color filter array may include color filters of red, green, blue and the like.

Meanwhile, the display device may further include a dummy pixel region 105 in the dead area adjacent to an edge of the pixel array 110 on the inside surface of the substrate 100. The dummy pixels may not receive driving signals because the dummy pixel region 105 is provided outside the active area A/A in which actual images are displayed.

The light-shielding pattern 200 may partially overlap the dummy pixel region 105 to reduce or prevent a light leakage that can be seen from the sides of the display device. In this embodiment, the light-shielding pattern 200 does not contact the active area A/A (represented by the dotted line of FIG. 3) and is disposed outside of the active area A/A.

The display device may further include an array of organic light emitting diodes 150 that covers the pixel array 110 and the dummy pixel region 105. Also, the display device may further include a pad electrode 125 that can be formed during the formation of the pixel array 110.

The organic light emitting diode array 150 may include a first electrode, an organic film including a light emitting layer and a second electrode in each pixel. The first electrode connected to the thin film transistor is patterned on a pixel basis, and the second electrode is formed in common over an entire surface. The second electrode may be formed so as to cover the underlying layers to protect the underlying organic film from the outside environment.

The display device may further include a polarizer 250 over an entire rear surface of the substrate 100 such that the polarizer 250 covers the light-shielding pattern 200.

The polarizer 250 may provide a circular polarization and also serve to reduce or prevent reflection of light from the metal layers contained in the organic light emitting diode array 150 and thus provides circular polarization. When the array formed on the substrate 100 does not include a reflective metal, the polarizer 250 may be omitted.

In FIGS. 4 and 5, light is emitted upward, and a sealing substrate 300 for sealing the pixel array 110 and the organic light emitting diode array 150 is further provided in the display device.

In this case, the sealing substrate 300 is adhered to an upper surface of an adhesive layer 170 that is formed on upper and side surfaces of the organic light emitting diode 150. The sealing substrate 300 may include a reflective metal and have a small thickness for a slim and flexible display device. In addition, the sealing substrate 300 is beneficially smaller than the substrate 100 so that an end of the sealing substrate 300 overlaps the light-shielding pattern 200, but does not overlap the mark hole 200a. The mark hole 200a is spaced from the end of the sealing substrate 300.

The adhesive layer 170 having an adhesion property may be formed of an adhesive substance including a light-shielding pigment and have a wet resistance to protect the inner configuration from moisture or exterior air.

Meanwhile, the pad electrode 125 is connected to a flexible printed circuit (FPC) 180 provided with a drive IC 190 for receiving control signals, and is folded toward a side of the sealing substrate 300. In addition, the flexible printed circuit 180 is connected to a printed circuit board (PCB) 400 that may include various control circuits including a timing controller (not shown).

A configuration of the inside surface of the substrate 100 may be accommodated and shielded by a support structure (not shown). In this case, when the printed circuit board 400 contacts a side or surface edge of the sealing substrate 300, a thickness of the configuration of the inside surface of the substrate 100 may be reduced or minimized even with the support structure, which can contribute to slimness of the display device.

Meanwhile, the light-shielding pattern 200 may be spaced from the end of the substrate 100. In this case, a distance between the light-shielding pattern 200 and the end of the substrate 100 is preferably 200 µm to 300 µm.

Figure 6:
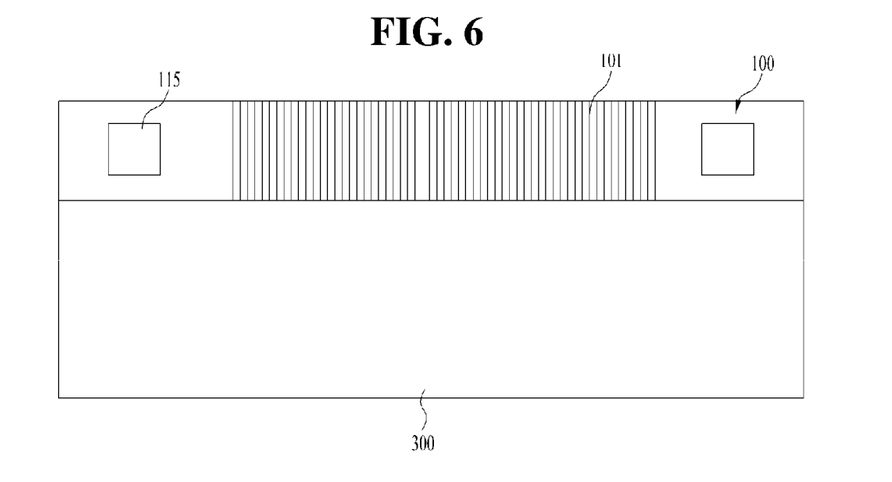
FIG. 6 is an enlarged plan view illustrating an alignment mark when the display device of FIG. 3 is upside down.
Figure 7:
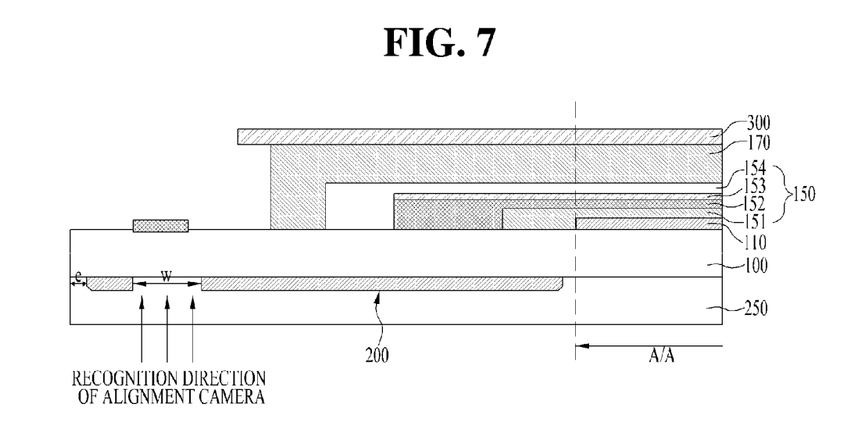
FIG. 7 is an enlarged sectional view illustrating an alignment mark when the display device of FIG. 3 is upside down.

FIG. 6 is an enlarged plan view of an alignment mark when the display device of FIG. 3 is upside down, and FIG. 7 is an enlarged sectional view of the alignment mark when the display device of FIG. 3 is upside down.

Referring to FIGS. 6 and 7, the alignment mark 115 is formed on the inside surface of the substrate 100 on which the pixel array 110 is formed. The alignment mark 115 may be formed of the same material as the link line 101 in a dead area outside the sealing substrate 300.

An organic light emitting display device according to an embodiment of the present invention will be described as an example with reference to FIG. 6.

A pixel array 110 including a thin film transistor and a first electrode connected thereto, an organic film 151 including a light emitting layer formed on the first electrode, a second electrode 152 formed so as to cover the organic film 151, a capping layer 153 formed on the second electrode 152 and a protective film 154 formed so as to cover an upper surface of the capping layer 153, and the capping layer 153 and a side surface of the second electrode 152 are formed on an inside surface of the substrate 100 that has an active area A/A and a dead area N/A.

In addition, a sealing substrate 300 is disposed so as to sufficiently shield an active area and the protective film 154 disposed around the active area, and an adhesive layer 170 is applied between the sealing substrate 300 and an inside surface of the substrate 100 on which the protective film 154 is formed to attach the two components. The sealing substrate 300 overlaps the light-shielding pattern 200, with its end spaced apart from a mark hole 200a, so that the alignment key 115 can be used during an alignment process after the sealing substrate 300 is attached to the substrate 100.

During formation of the pixel array 110, the alignment mark 115 is formed in a part of the dead area N/A in the same layer as a metal line. The mark hole 200a is formed in the light-shielding pattern 200 printed on a rear surface of the substrate 100, which allows a lower alignment camera to recognize the alignment key 115, even with the light-shielding pattern 200.

In addition, a polarizer 250 is adhered so as to cover the light-shielding pattern 200 printed on the rear surface of the substrate 100. In this case, the polarizer 250 has a size corresponding to the substrate 100 and is adhered to a rear surface of the substrate 100 by, for example, a roll-to-roll process.

The mark hole 200a has a first width w in a region corresponding to the alignment mark 115. As illustrated in FIG. 6, when the alignment mark 115 has a square shape, the mark hole 200a may have a width and a length that are equal to the first width w so that the distance between the alignment mark 115 and the edge of the mark hole 200a is uniform. When the alignment mark 115 has other shapes, the width and the length of the mark hole 200a may be changed. Beneficially, the mark hole 200a has a size larger than that of the alignment mark 115 in consideration of process margin.

Figure 8A:
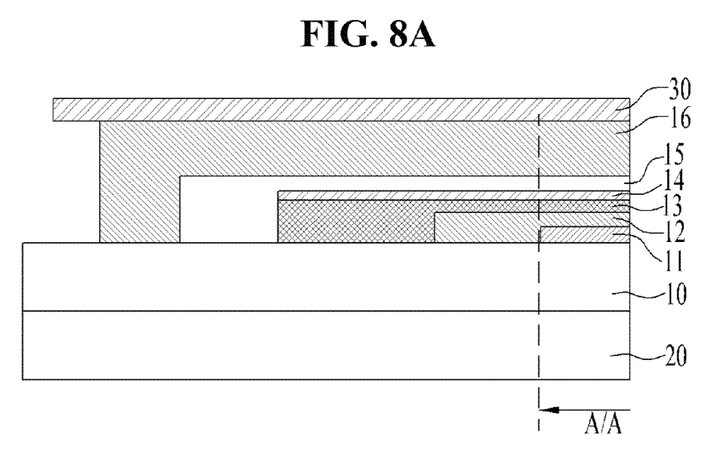
FIGS. 8A and 8B are sectional and plan views of a comparative example, in which no light-shielding pattern is formed.
Figure 8B:
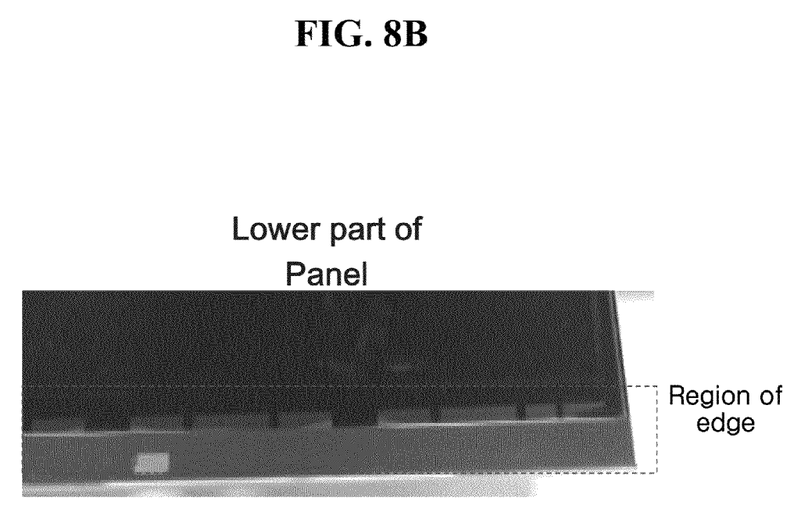

FIGS. 8A and 8B are sectional and plan views of a comparative example, in which no light-shielding pattern is formed, for explaining a problem of the comparative example.

The display device of this comparative example has the same configuration as the display device according to an embodiment of the present invention described above in that a pixel array 11, an organic film 12, a second electrode 13, a capping layer 14, a protective film 15, an adhesive layer 16 and a sealing substrate 30 are provided on an inside surface of a substrate 10, and a polarizer 20 is further provided on a rear surface of the substrate 10.

Referring to FIG. 8A, the display device, however, does not include a light-shielding pattern. In this case, as illustrated in FIG. 8B, a pad unit at a periphery of the display device can be seen from the outside, and the viewer can see metal lines disposed on an inside surface of the substrate 100. Accordingly, in this configuration, the viewer may recognize a visual defect.

To address such a problem, a display device according to an embodiment of the present invention includes a light-shielding pattern 200 that is formed by, for example, a printing method in a dead area of the display device so that the pad unit can be visually shielded from the viewer.

The light-shielding pattern 200 is provided on a rear surface of the substrate 100 that corresponds to a display surface on which images are actually displayed. The polarizer disposed on the rear surface of the substrate 100 may be omitted depending on optical properties of the display device. When the first electrode connected to the thin film transistor adjacent to the display surface (rear surface of the substrate) is a transparent electrode and the second electrode is a reflective metal, the organic light emitting display panel described above is adhered to a rear surface of the substrate 100 in order to reduce or prevent reflection of exterior light by the reflective metal.

Hereinafter, various examples of a light-shielding pattern of a display device according to an embodiment of the present invention will be described.

Figure 9:
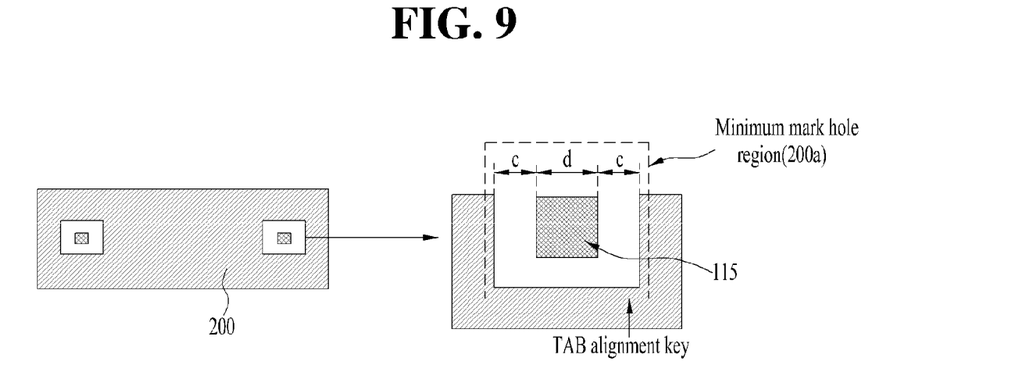
FIG. 9 is an enlarged view illustrating an alignment mark and a mark hole of a display device according to an embodiment of the present invention.

FIG. 9 is an enlarged view illustrating an alignment mark and a mark hole of a display device according to an embodiment of the present invention.

Referring to FIG. 9, an alignment mark 115 is disposed on an inside surface of a substrate 100. The alignment mark 115 may function to align respective layers upon formation of an array on the inside surface of the substrate 100. In addition, the alignment mark 115 may serves as an alignment key during a TAB bonding of a flexible printed circuit (FPC) connected to a pad unit of the substrate 100. In this case, when the mark hole 200a of the light-shielding pattern 200 is completely filled with the alignment mark 115, it may be difficult to distinguish areas from one another. The alignment mark 115 is preferably spaced apart by a predetermined distance from an edge of the mark hole 200a of the light-shielding pattern 200.

In FIG. 9, the alignment mark 115 has a square shape having a side length d, and the mark hole 200a is spaced apart from the alignment mark 115 by a distance c. As such, the alignment mark 115 is spaced apart from the edge of the mark hole 200a of the light-shielding pattern 200 by the predetermined distance c, thus providing precise alignment during a bonding process of a drive IC on a flexible printed circuit.

In addition, bubbles may be generated on the mark hole 200a of the light-shielding pattern 200 when a polarizer 250 is attached onto the rear surface of the substrate 100. Thus, an open region of the mark hole 200a beneficially has a predetermined size to reduce or prevent generation of such bubbles. For example, no generation of bubbles was seen, when the light-shielding pattern 200 has a thickness of about 1 μm to about 2.5 μm and the open region of the mark hole 200a has a width of 500 μm to 1,000 μm and a length of 500 μm to 1,000 μm.

Figure 10A:
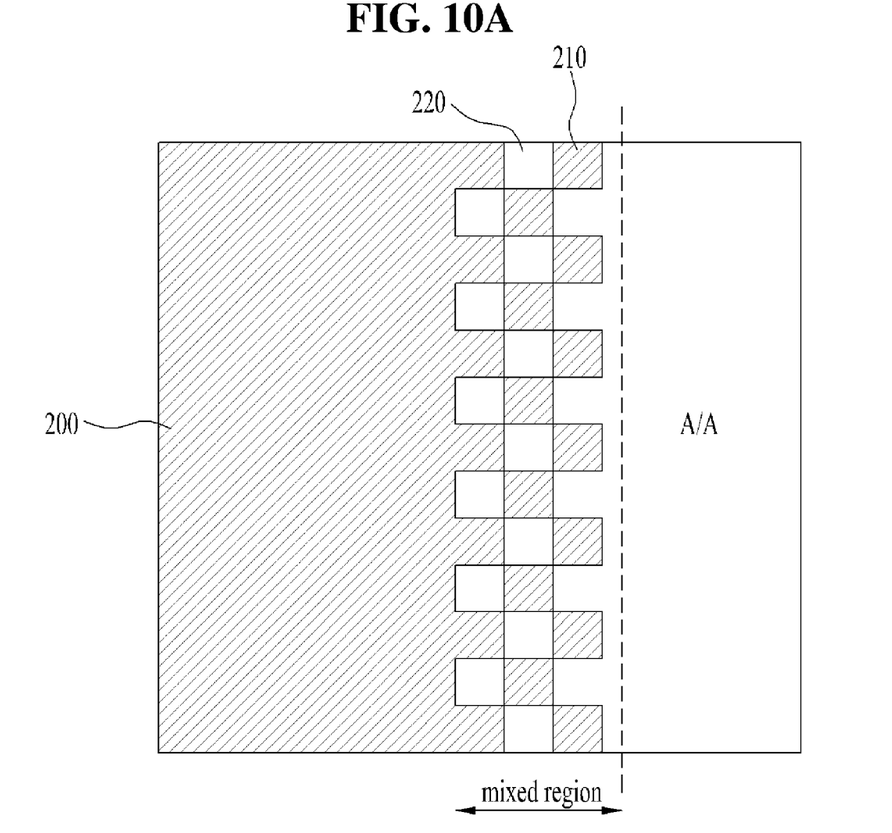
FIGS. 10A and 10B are plan and sectional views of a display device according to an embodiment of the present invention.
Figure 10B:
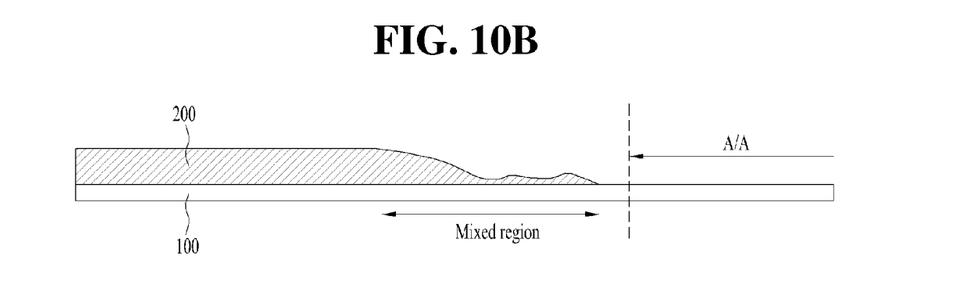

FIGS. 10A and 10B are plan and sectional views illustrating a light-shielding pattern of a display device according to another embodiment of the present invention.

Referring to FIG. 10A, a light-shielding pattern 200 has a dot shape in which a printing area 210 is mixed with a non-printing area 220 at a boundary between the active area A/A and the dead area N/A.

The dot shape may reduce or prevent a clear boundary between a region where a light-shielding pattern having a linear shape is formed and a region where the light-shielding pattern is not formed from being seen from the outside. In this case, an edge of the light-shielding pattern 200 has a gradually decreased thickness, which may reduce or prevent the edge of the light-shielding pattern 200 from being clearly recognized by the user, as illustrated in FIG. 10B.

Figure 11A:
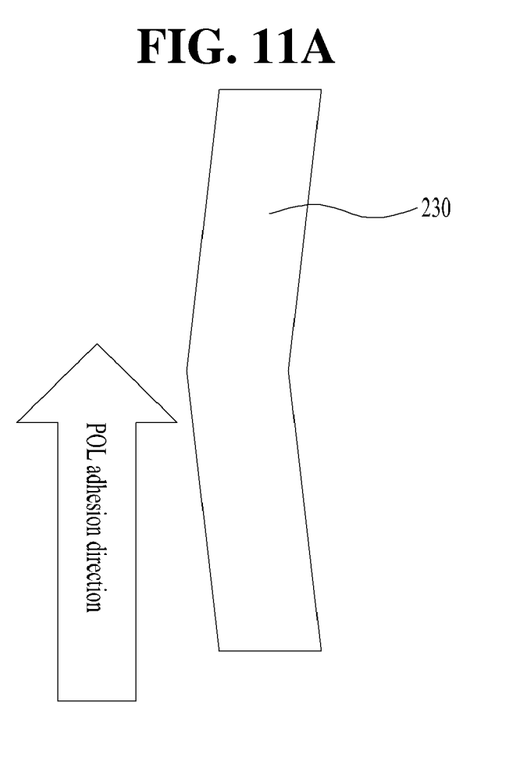
FIGS. 11A and 11B are plan views illustrating a light-shielding pattern of a display device according to an embodiment of the present invention.
Figure 11B:
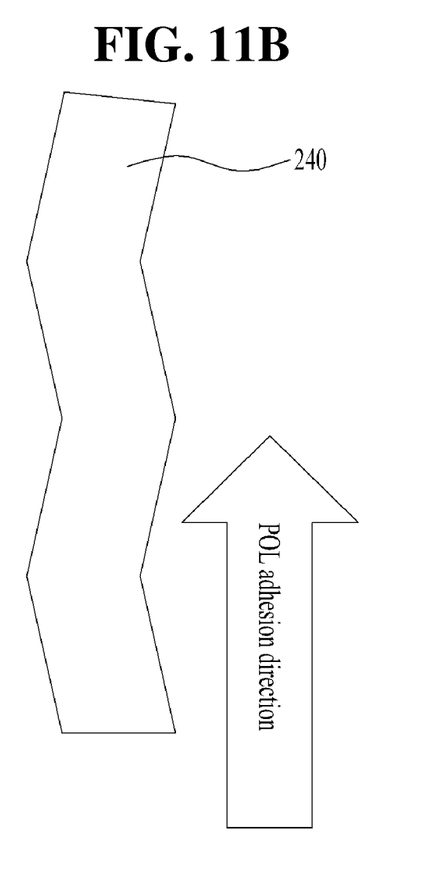

FIGS. 11A and 11B are plan views illustrating a light-shielding pattern of a display device according to another embodiment of the present invention.

Referring to FIG. 11A, a light-shielding pattern 230 may be formed in a diagonal line direction with an acute angle with respect to an adhesion direction of a polarizer. In this case, bubbles generated along an edge of a light-shielding pattern having a linear shape may be reduced or prevented due to such a directional property of the light-shielding pattern 230. In this case, a portion of the light-shielding pattern 230 that is formed in a diagonal line direction is provided adjacent to the active area, and a portion of the light-shielding pattern 230 that is provided at an end of the substrate 100 has a linear shape.

Referring to FIG. 11B, a light-shielding pattern 240 has a zig-zag pattern in which portions of the light-shielding pattern 240 formed in two diagonal line directions are repeated. It is beneficial to repeat the zig-zag pattern having a small size to obscure a specific directionality of the light-shielding pattern 240.

Figure 12:
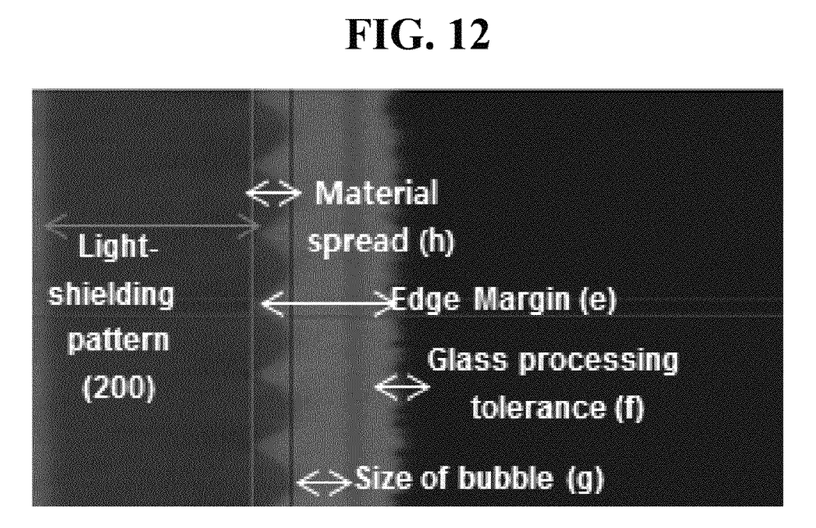
FIG. 12 is an image showing an edge margin of a light-shielding pattern of a display device according to an embodiment of the present invention.

FIG. 12 is an image showing an edge margin of a light-shielding pattern of a display device according to an embodiment of the present invention.

The edge margin (e) of a light-shielding pattern of a display device according to an embodiment of the present invention is determined in consideration of spread degree (h) of a material for the light-shielding pattern, process tolerance (f) of the substrate, size of bubbles (g) generated upon adhesion of the polarizer, and size of droplets upon printing of the light-shielding pattern, and the light-shielding pattern is printed at a position spaced from an end of the substrate by a distance corresponding to the edge margin.

During printing, the light-shielding pattern is spaced from an edge of the substrate by a distance substantially corresponding to the edge margin, but the light-shielding pattern may spread during a baking process after the printing process. Due to the edge margin (e), although the light-shielding pattern spreads outwardly, it hardly contacts an end of the substrate. The edge margin (e) is considered so as to reduce or prevent defects such as stain by a liquid light-shielding pattern material spreading to an end of the substrate or droplets concentrated at an end of the substrate.

Figure 13:
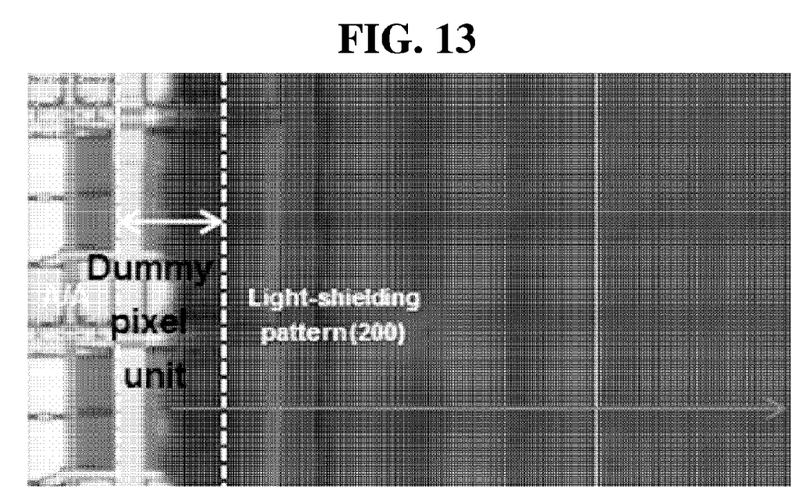
FIG. 13 is an image showing an overlap relationship between a light-shielding pattern and a dummy pixel unit in a display device according to an embodiment of the present invention.

FIG. 13 is an image showing an overlap relationship between a light-shielding pattern and a dummy pixel unit in a display device according to an embodiment of the present invention.

FIG. 13 illustrates a region of a light-shielding pattern that is adjacent to an active area of the substrate 100. The dummy pixel unit adjacent to the active area partially overlaps the light-shielding pattern to reduce or prevent the side surface from being seen from the outside. The light-shielding pattern may overlap one or more dummy pixels to sufficiently reduce or prevent the pad unit from being seen from the outside.

Meanwhile, a width (a or b, see FIG. 3) of the light-shielding pattern corresponds to a value, at each side, obtained by subtracting an edge margin e and the distance s between the end of the active area and the end of the light-shielding pattern overlapping the dummy pixel unit from a width (dd, see FIG. 3) of the dead area. That is, a or b=dd−e−s.

Figure 14:
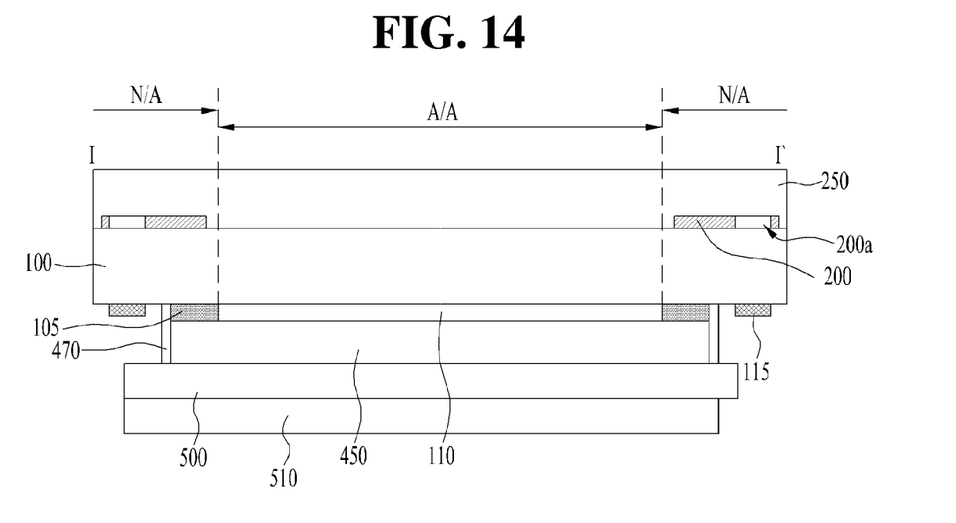
FIG. 14 is a sectional view illustrating a display device according to an embodiment of the present invention.

FIG. 14 is a sectional view illustrating a display device according to another embodiment of the present invention.

Thus far, a display device according to an embodiment of the present invention is described with an organic light emitting display device as an example. FIG. 14 illustrates an example in which a display device according to an embodiment of the present invention is a liquid crystal display (LCD) device.

Referring to FIG. 14, the display device includes a substrate 100 having an active area A/A and a dead area N/A disposed around the active area, the substrate 100 having a pixel array 110 in the active area A/A on an inside surface of the substrate 100, an alignment mark 115 disposed in a part of the dead area N/A on the inside surface of the substrate 100, and a light-shielding pattern 200 disposed in the dead area N/A on a rear surface of the substrate 100, with the light-shielding pattern 200 provided with a mark hole 200a for exposing the alignment mark and formed by a printing process. Thus far, the display device has substantially the same configuration as illustrated in FIG. 5. In addition, the display device includes an opposite substrate 500, a liquid crystal layer 450 disposed between the opposite substrate 500 and the substrate 100 and an opposite polarizer 510 disposed on a surface of the opposite substrate 500.

In this case, a flexible printed circuit connected to the pad electrode may be adhered to a surface of the polarizer 510, and a backlight unit (not shown) is further provided under the polarizer 510 to emit light upward.

In addition, a sealing material 470 is applied to an edge of the substrate 100 and an edge of the opposite substrate 500 to confine the liquid crystal layer 450 and attach the substrates 100 and 500 together.

As such, the LCD device has a borderless structure by printing the light-shielding pattern 200 on the rear surface of the substrate 100 and setting the rear surface of the substrate 100 to the display surface.

Meanwhile, although an organic light emitting display device and a liquid crystal display have been described as examples of a display panel, the present invention is not limited thereto. For example, a borderless structure can be applied to a display panel in which an alignment mark is formed on an inside surface of the substrate.

The display device according to the present invention may have the following advantages.

A display device according to an embodiment of the present invention has a borderless structure in which a support structure such as a frame may not be provided on a display surface. A light-shielding pattern is disposed in the dead area on an inside surface of the substrate in order to reduce or prevent metal electrodes and metal lines in the pad unit from being seen from the outside.

Also, a mark hole may be formed in the light-shielding pattern in a region corresponding to an alignment mark. As a result, although a light-shielding material is provided in the dead area, alignment between various layers is possible during the array process or the alignment mark can be recognized during a module process for bonding drive IC, thus eliminating an additional process for forming an alignment key and simplifying the overall manufacturing process and reducing tact time.

In addition, the light-shielding pattern may be formed in a diagonal line direction with respect to adhesion direction of the polarizer, or the light-shielding pattern is spaced apart from an edge of the substrate by a predetermined distance, or an open region having a certain size of the mark hole is provided in order to reduce or prevent generation of bubbles upon adhesion of the polarizer to a rear surface of the substrate.

It is possible to reduce or prevent metals from being seen from the outside by providing a light-shielding pattern on a rear surface of the substrate, to increase an active display area of the display device and thus to enhance the overall visual appreciation.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
    a substrate having an active area and a dead area around the active area, the substrate having a pixel array on an inside surface of the substrate in the active area;
    an alignment mark on the inside surface of the substrate in a part of the dead area; and
    a light-shielding pattern on a rear surface of the substrate, which is opposite to the inside surface and from which an image formed by the pixel array on the inside surface is transmitted to a viewer, exclusively in the dead area, the light-shielding pattern including a mark hole for exposing the alignment mark.

2. The display device according to claim 1, further comprising a polarizer on the rear surface of the substrate, the polarizer covering the light-shielding pattern.

3. The display device according to claim 2, wherein the light-shielding pattern is spaced apart from an edge of the substrate.

4. The display device according to claim 3, wherein the light-shielding pattern is spaced apart from the edge of the substrate by a distance of 200 µm to 300 µm.

5. The display device according to claim 2, wherein the light-shielding pattern has a dot shape at a boundary of the active area and the dead area.

6. The display device according to claim 2, wherein the light-shielding pattern is formed in a diagonal line direction having an acute angle with respect to an adhesion direction of the polarizer.

7. The display device according to claim 2, wherein the alignment mark is spaced apart from an edge of the mark hole by a predetermined distance.

8. The display device according to claim 1, further comprising a dummy pixel unit in the dead area adjacent to an edge of the pixel array on the inside surface of the substrate.

9. The display device according to claim 8, wherein the light-shielding pattern overlaps a part of the dummy pixel unit.

10. The display device according to claim 1, wherein the pixel array comprises a thin film transistor array and an organic light emitting diode array.

11. The display device according to claim 10, wherein the alignment mark is disposed in a layer of the thin film transistor array.

12. The display device according to claim 1, further comprising:
    a protective film covering the pixel array disposed on the inside surface of the substrate;
    an adhesive layer covering an upper surface and a side surface of the protective film, the adhesive layer disposed on the inside surface of the substrate; and
    a sealing substrate adhered to an upper surface of the adhesive layer.

13. The display device according to claim 12, wherein the sealing substrate comprises a metal.

14. The display device according to claim 13, wherein the mark hole is spaced apart from an edge of the sealing substrate and the sealing substrate overlaps the light-shielding pattern in a region not corresponding to the mark hole.

15. The display device according to claim 1, wherein the rear surface of the substrate is a display surface to the viewer.

* * * * *